United States Patent
Ogatsu (10) Patent No.: US 8,373,284 B2
(45) Date of Patent: Feb. 12, 2013

(54) SEMICONDUCTOR DEVICE (75) Inventor: Toshinobu Ogatsu, Tokyo (JP)

(73) Assignee: NEC Corporation, Tokyo (JP)

(*) Notice: Subject to any disclaimer, the term of this patent is extended or adjusted under 35 U.S.C. 154(b) by 494 days.

(21) Appl. No.: 12/682,677

(22) PCT Filed: Oct. 9, 2008

(86) PCT No.: PCT/JP2008/068354
§ 371 (c)(1),
(2), (4) Date: Apr. 12, 2010

(87) PCT Pub. No.: WO2009/048097
PCT Pub. Date: Apr. 16, 2009

(65) Prior Publication Data
US 2010/0213622 A1 Aug. 26, 2010

(30) Foreign Application Priority Data
Oct. 10, 2007 (JP) .................................. 2007-264369

(51) Int. Cl.
H01L 23/31 (2006.01)
(52) U.S. Cl. .. 257/788; 257/737; 257/778; 257/E23.129
(58) Field of Classification Search ........... 257/E23.129, 257/737, 778, 788
See application file for complete search history.

(56) References Cited

U.S. PATENT DOCUMENTS

| | | | | |
|---|---|---|---|---|
| 6,458,681 | B1* | 10/2002 | DiStefano et al. | 438/612 |
| 7,687,890 | B2* | 3/2010 | Subramanian et al. | 257/629 |
| 7,759,802 | B2* | 7/2010 | Miyazaki | 257/778 |
| 2006/0281220 | A1* | 12/2006 | Kuramochi | 438/106 |

FOREIGN PATENT DOCUMENTS

| | | |
|---|---|---|
| JP | 10-340977 A | 12/1998 |
| JP | 2004-179578 A | 6/2004 |
| JP | 2004-292250 A | 10/2004 |
| JP | 2004-312051 A | 11/2004 |
| JP | 2007-165830 A | 6/2007 |
| JP | 2007-165832 A | 6/2007 |

OTHER PUBLICATIONS

International Search Report for PCT/JP2008/068354, mailed Nov. 4, 2008.
A. Fujishima, "Optical Catalyst", Japan Society of Chemistry, Maruzen Company, Sep. 2005, pp. 6-9, 101-121.

* cited by examiner

Primary Examiner — Roy Potter

(57) ABSTRACT

A semiconductor device carries a semiconductor component on a substrate and having an underfill resin applied in a gap between the substrate and the semiconductor component. The semiconductor device comprises: a lyophilic area in a portion of a region of one or both of the substrate and the semiconductor component which is in contact with the underfill resin. The lyophilic area is processed to exhibit lyophilicity with respect at least to the liquid underfill resin in comparison with an ambient region of the lyophilic area.

7 Claims, 11 Drawing Sheets (EXAMPLE 1)

FIG. 2

(EXAMPLE 1)
X-X'

FIG. 4A [EXAMPLE 1] [COMPARATIVE EXAMPLE] (NO LYOPHILIZED AREA)

FIG. 6 (EXAMPLE 4)

FIG. 7 (EXAMPLE 4) MODIFIED EXAMPLE 1

FIG. 8

FIG. 10 (EXAMPLE 5)

FIG. 11 (EXAMPLE 6)

SEMICONDUCTOR DEVICE

The present application is the National Phase of PCT/JP2008/068354, filed on Oct. 9, 2008, which claims priority rights based on the Japanese Patent Application 2007-264369, filed in Japan on Oct. 10, 2007, the entire disclosure thereof being incorporated herein by reference thereto.

TECHNICAL FIELD

This invention relates to a semiconductor device including a semiconductor component mounted on a substrate via a plurality of solder bumps. More particularly, it relates to a semiconductor device having an underfill resin applied into a gap between the substrate and the semiconductor component.

BACKGROUND ART

The number of situations of users carrying about mobile phones, mobile information terminals, portable devices reproducing music or video, or game machines, to say nothing of notebook personal computers, is increasing. These electronic devices are required to be of high reliability under a variety of adverse using environments, including a drop impact load, car vibrations and so forth. Hence, an increasing demand is placed on a technique of high strength component packaging. On the other hand, since the number of components packaged increases with function augmentation, there is a strong demand for development of high density thin thickness packaging techniques. Since the high density, thin thickness and the high strength are in contradiction to one another, a wide variety of reports have been made in connection with techniques targeted at realization of high density and thin thickness. Under these situations, LGA (Land Grid Array) type packages are coming into widespread use to reduce the thickness of the packaging structures of the semiconductor packages.

There is simultaneously raised a demand for narrow pitch, such that, in the field of secondary packaging, the demand for low height ascribable to use of the LGA and the demand for narrow pitch need to be satisfied together. On the other hand, in a new type package, such as SiP (System In Package) or PoP (Package on Package), the package tends to be increased in size.

To take the above into account and to maintain the same reliability as before, it is a frequent occurrence that reinforcement by an underfill resin becomes necessary. As techniques to cope with the demand for a larger area and a narrow gap, the following techniques have so far been proposed. In Patent Document 1, for example, there is proposed a technique of previously supplying a resin to a packaging area of a semiconductor package in place of applying resin from a lateral side to permit its permeation. In Patent Document 2, there is proposed a technique of using surface-modified spherical silica as a filler material used for reinforcement to improve its fluidity.

[Patent Document 1] JP Patent Kokai Publication No. JP-P2004-312051A
[Patent Document 2] JP Patent Kokai Publication No. JP-P2004-292250A
[Non-Patent Document 1] 'Optical Catalyst', edited by Japan Society of Chemistry, edited and supervised by Akira Fujishima, Maruzen Company, September 2005

SUMMARY

The entire disclosures of the Patent Documents 1 and 2 and the Non-Patent Document 1 are to be incorporated herein by reference thereto. The following is an analysis of the related techniques by the present invention.

In applying an underfill resin to a packaging structure which has become larger in size and shorter in height, there is presented a problem that, if an underfill resin is applied from a lateral side to a packaging structure, it is difficult that the resin in its entirety is permeated and applied evenly.

In contrast thereto, the technique of Patent Document 1 is effective because it is not of the system in which the resin is applied and permeated from the lateral side. It is however necessary to supply the resin before component packaging, and to carry out soldering by free lead reflow after applying the resin. It is thus necessary to use a shape of the packaging structure such that lead will avoid the resin during the solder printing. In this case, there is a risk of the resin mixing into the site of solder connection to cause handling difficulties.

Patent Document 2 is presupposed on filler charging. There are however many cases where the filler is desirably not used in consideration of reliability. The technique of Patent Document 2 thus may not be used in critical cases.

It is an object of the present invention to enable an underfill resin to be evenly permeated and applied in case it is delivered to a gap between a semiconductor component and a substrate of a semiconductor device that has become larger in size and lower in height.

In one aspect of the present invention, there is provided a semiconductor component carrying a semiconductor device on a substrate and having an underfill resin applied in a gap between the substrate and the semiconductor component. A lyophilic area is provided in a portion of a region of one or both of the substrate and the semiconductor component which is in contact with the underfill resin. The lyophilic area is processed to exhibit lyophilicity with respect at least to the liquid underfill resin in comparison with an ambient region of the lyophilic area.

According to the present invention, an underfill resin may be supplied in stability in a manner free from fluctuations. In general, if the connection height of the substrate and that of the semiconductor component are reduced, reliability is lowered. Nevertheless, the connection height may be reduced because the underfill resin may be applied in stability despite the reduced connection height of the semiconductor component. Since an air sink at the mid portion of the semiconductor component may be removed, it is possible to reduce the stress to the substrate caused on heating/cooling. Moreover, since the air sink at the mid portion of the semiconductor component may be removed, it is also possible to reduce the adverse effect of distortion of the substrate on the component mounted on the reverse substrate side in case of double-side packaging. In addition, since the affinity of the surface of the lyophilic area on the solder resist with the underfill resin may be improved, the underfill resin may be improved in the bonding performance.

PREFERRED MODES

Figure 2:
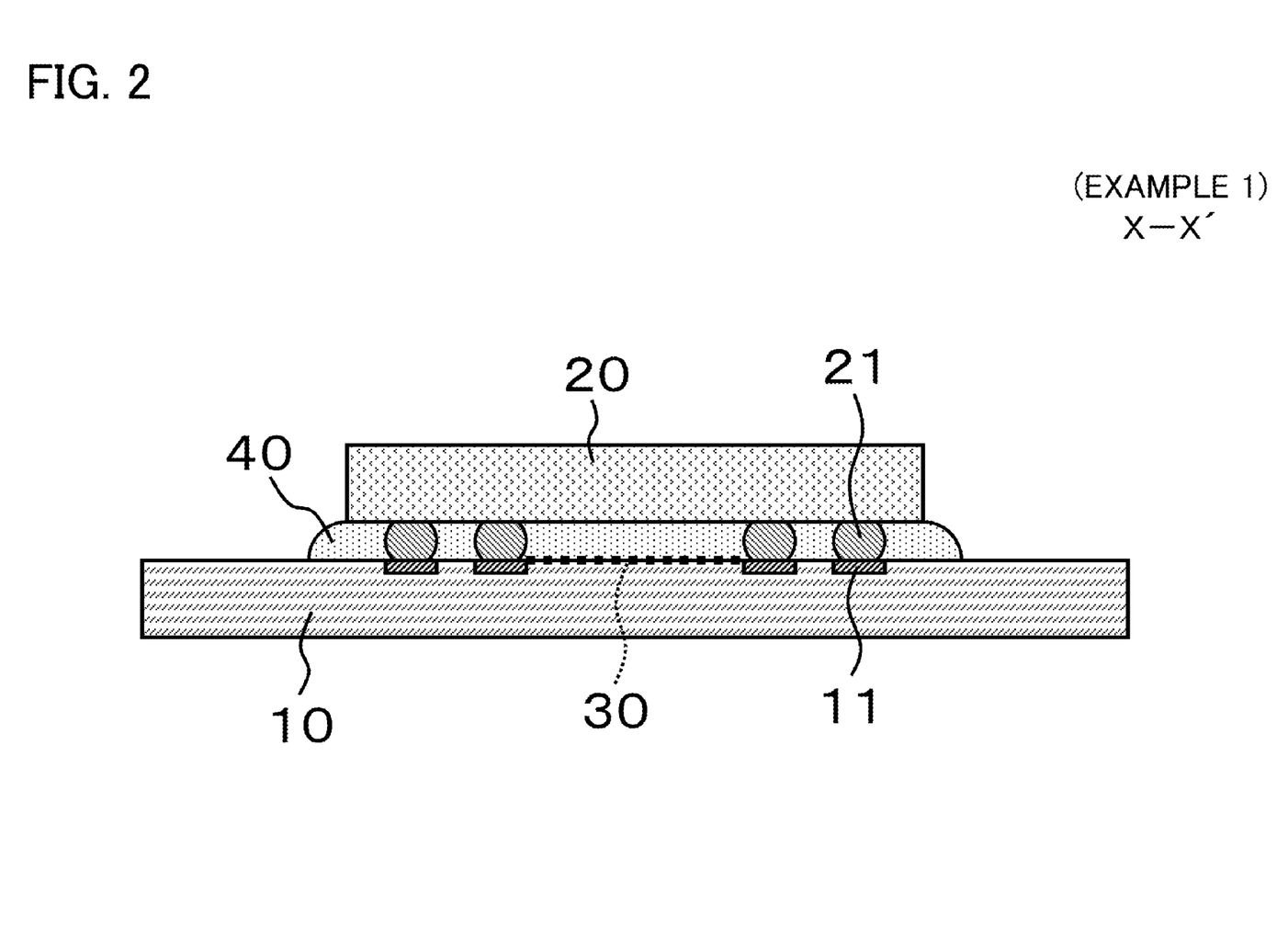
FIG. 2 is a schematic cross-sectional view showing the formulation of a semiconductor device according to Example 1 of the present invention.

A semiconductor device according to an exemplary embodiment of the present invention carries a semiconductor component (20 of FIG. 2) on a substrate (10 of FIG. 2) and having an underfill resin (40 of FIG. 2) applied in a gap between the substrate (10 of FIG. 2) and the semiconductor component (20 of FIG. 2). The semiconductor device includes a lyophilic area (30 of FIGS. 2,10 and 11) in a portion of a region of one or both of the substrate (10 of FIG. 2) and the semiconductor component (20 of FIG. 2) in contact with the underfill resin (40 of FIG. 2). The lyophilic area is processed to exhibit lyophilicity with respect to at least the liquid underfill resin in comparison with an ambient region (exemplary embodiment 1).

The following exemplary embodiments are also possible:

The lyophilic area is preferably processed so as to have a contact angle smaller than that of the ambient region of the lyophilic area (exemplary embodiment 2).

The ambient region of the lyophilic area is preferably more lyophobic with respect to at least the liquid underfill resin than the lyophilic area (exemplary embodiment 3).

Preferably, the ambient region of the lyophilic area is coated with a solder resist, and a film of titanium oxide processed to lyophilic (termed as "lyophilic-processed") by exposure to ultraviolet light is formed on a solder resist in the lyophilic area (exemplary embodiment 4).

Preferably, the ambient region of the lyophilic area is coated with a solder resist, and the surface of the solder resist is modified by ion irradiation in the lyophilic area (exemplary embodiment 5).

Preferably, the lyophilic area is arranged at a center part of an area where at least the semiconductor component is mounted (exemplary embodiment 6).

Preferably, at least the lyophilic area includes one or more guide paths extended from a mid part of an area where the semiconductor component is mounted (exemplary embodiment 7).

Example 1

Figure 1:
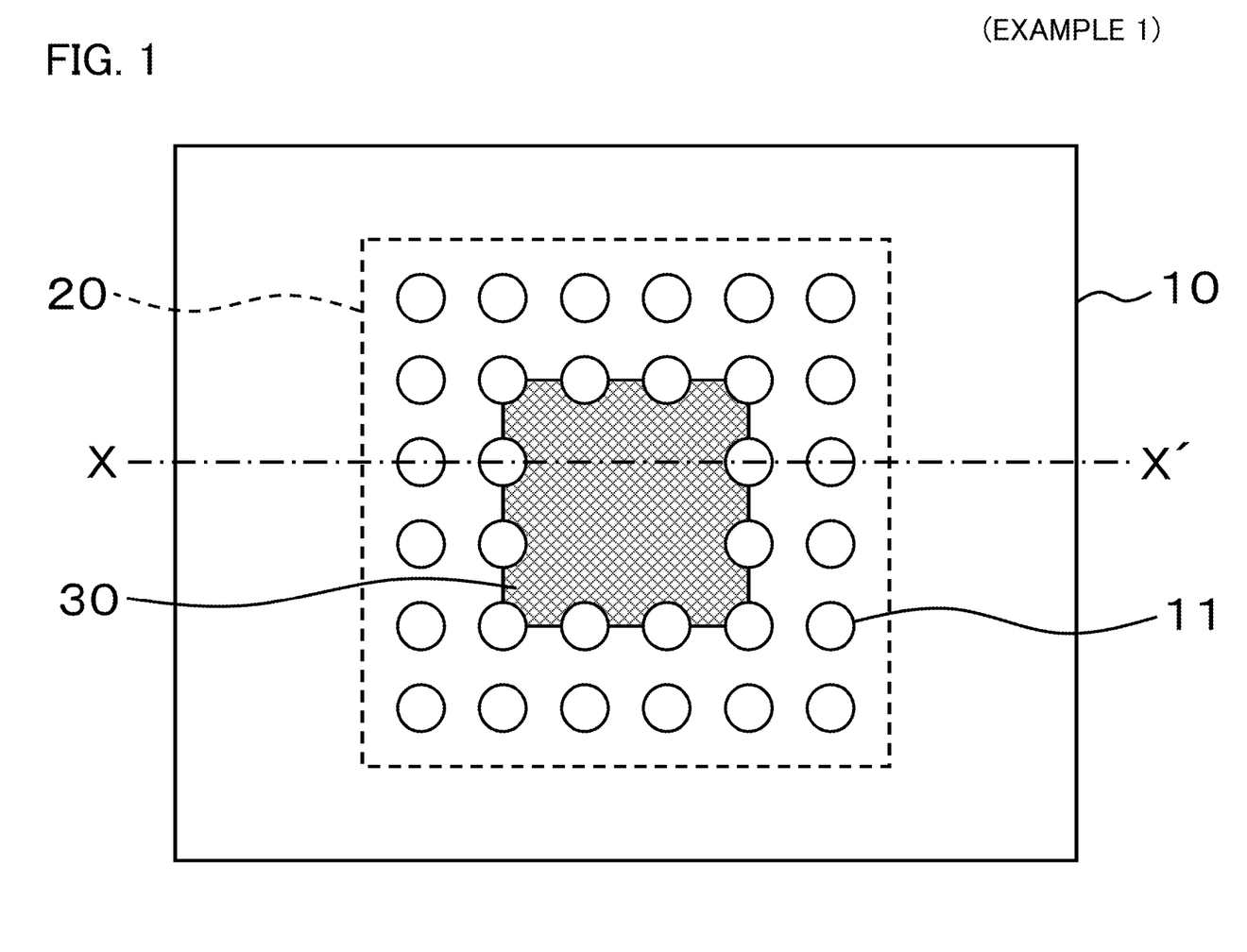
FIG. 1 is a plan view schematically showing a lyophilic area of a substrate in a semiconductor device of Example 1 of the present invention.
Figure 3:
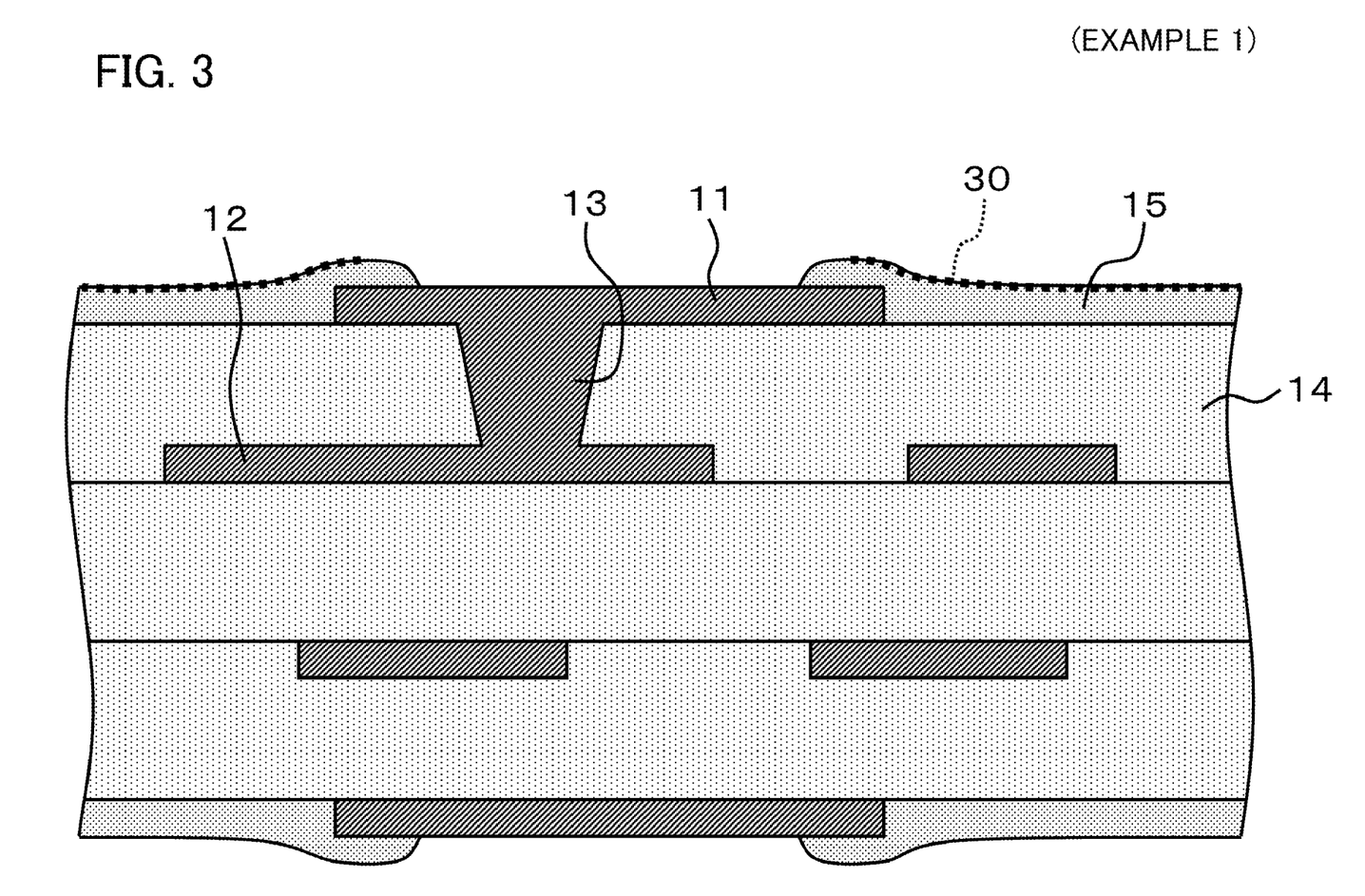
FIG. 3 is an enlarged partial cross-sectional view schematically showing the formulation of a substrate in the semiconductor device according to Example 1 of the present invention.

A semiconductor device according to Example 1 of the present invention will now be described with reference to the drawings. FIG. 1 depicts a plan view schematically showing a lyophilic area of a substrate in a semiconductor device of Example 1 of the present invention. FIG. 2 depicts a schematic cross-sectional view showing the formulation of a semiconductor device according to Example 1 of the present invention. FIG. 3 depicts an enlarged partial cross-sectional view schematically showing the formulation of a substrate of the semiconductor device according to Example 1 of the present invention.

A semiconductor device according to Example 1 is such a semiconductor device in which a semiconductor component 20 is mounted via a plurality of solder bumps 21 on a substrate 10, and in which an underfill resin 40 is applied into a gap between the substrate 10 and the semiconductor component 20.

The substrate 10 is a multi-layered wiring substrate in which interconnections 12 and insulating layers 14 are alternately stacked and in which the interconnections are connected together by vias 13, while the interconnections and the pads are also connected together by vias 13. A plurality of pads 11 are formed on a surface of the substrate 10 facing the semiconductor component 20. The rim part of the pads 11 and the surface of the insulating layer 14 are coated with a solder resist 15 to prevent shorting across neighboring bumps 21 as well as to provide insulation from a circuit provided on the substrate surface. The solder resist 15 is not provided on a center area of the surface of the pad 11.

The solder resist 15 is formed of an organic material, such as an epoxy-based organic material. In comparison with the lyophilic area 30, the solder resist 15 exhibits lyophobicity at least with respect to the liquid underfill resin 40. The pad 11 is electrically connected to the semiconductor component 20 via the solder bumps 21. The lyophilic area 30 is formed on a preset site on the surface of the solder resist 15. The substrate 10 may, for example, be a customarily used interposer substrate for a semiconductor package. A substrate formed of resin is used as a substrate for packaging the interposer substrate.

The semiconductor component 20 is composed of a semiconductor chip or a semiconductor package. A plurality of pads, not shown, is formed on the surface of the semiconductor component 20 facing the substrate 10. These pads are electrically connected to the pads 11 on the substrate 10 via solder bumps 21. A solder resist, not shown, is applied to the surface of the semiconductor component 20 facing the substrate 10, excluding the pad surface, in order to prevent shorting across neighboring bumps 21.

The lyophilic area 30 is formed to a rectangular shape at a mid portion of an area of the surface of the solder resist 15 on which the semiconductor component 20 is mounted. The lyophilic area 30 is formed by selectively performing the lyophilic-processing on the solder resist 15. The speed of permeation of the underfill resin 40 may be controlled in different areas by providing the lyophilic area 30.

An example of the lyophilic-processing method is applying a film of titanium oxide followed by irradiation of ultraviolet rays. The solder resist 15 is formed of an epoxy-based organic material and hence its surface exhibits lyophobicity. However, if a film of titanium oxide is applied, such as by spray coating, on the surface of the solder resist 15, the solder resist may exhibit lyophilicity subject to subsequent ultraviolet ray irradiation. However, after lapse of certain time, the solder resist surface reverts to its inherent lyophobicity, depending on the amount of irradiation. It is therefore necessary to perform the operations of supplying the solder, mounting the component and reflow, in this order, after the irradiation of the ultraviolet rays.

The underfill resin 40 is a resin filled into the gap between the substrate 10 and the semiconductor component 20. The underfill resin 40 is a liquid sealant solidified. The liquid sealant may be classified, depending on the sort or dosage form of the resin, into a thermosetting, thermoplastic, solvent, non-solvent, one-liquid or two-liquid type. The liquid sealant may be formed mainly of epoxy resin.

The method for manufacturing a semiconductor device according to Example 1 of the present invention will now be described.

The solder resist 15 is formed after the end of preparation of the ultimate surface circuit in the course of the process for producing the substrate 10. In general, a film resist is applied by a laminator, or a liquid solder resist is formed by screen printing, spray coating or curtain coating.

After forming the solder resist, the lyophilic area 30 is formed. In forming the lyophilic area 30, a film of titanium oxide is deposited by spin coating, dip coating or spray coating. The resulting assembly is then irradiated with ultraviolet light via a mask having an opening in register with an area desired to be lyophilic-processed. An unneeded portion of the film is dissolved in an alkaline aqueous solution. As a result, only the area of the substrate in register with the opening in the mask is subjected to lyophilic-processing, whereby a film of titanium oxide, which is to form the lyophilic area 30, is formed on the solder resist 15 of the ordinary substrate 10. Since the film of titanium oxide usually exhibits lyophobicity, it may, as it is, exhibit the property as a solder resist.

The semiconductor component 20 then is applied by solder printing or reflow soldering, followed by cooling.

The underfill resin 40 then is formed. In forming the underfill resin 40, the underfill resin is supplied from a lateral side of the semiconductor component 20. The underfill resin 40 is then permeated into the gap between the semiconductor component 20 and the substrate 10 by capillary action.

Here, the ultraviolet light is illuminated before solder printing. However, the ultraviolet light may also be illuminated after solder printing and before mounting the component. In this case, the time after illumination of the ultraviolet light until applying the underfill is shortened, even if only to a limited extent, and hence a stronger lyophilicity may be attained. Meanwhile, since the light exposure is carried out after the solder printing, the light exposure is effected such that exposure light is performed so as to avoid the site of solder printing.

The action of permeation of the underfill resin in the semiconductor device of Example 1 of the present invention will now be described with reference to the drawings. FIGS. 4(A) to (E) show the action of permeation of the underfill resin in the semiconductor device of Example 1 of the present invention in comparison with that of the Comparative Example.

Figure 4A:
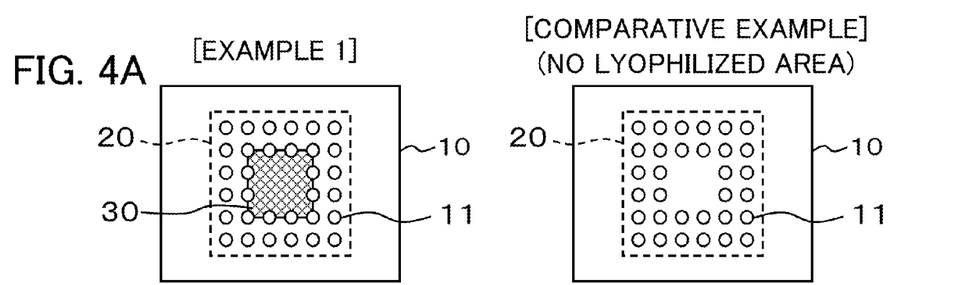
FIGS. 4A to 4E are schematic views for comparison of the action of permeation of an underfill resin in the semiconductor device of Example 1 of the present invention with that of a Comparative Example.
Figure 4B:
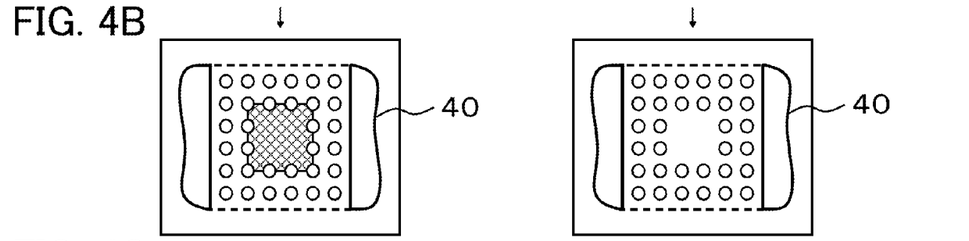
Figure 4C:
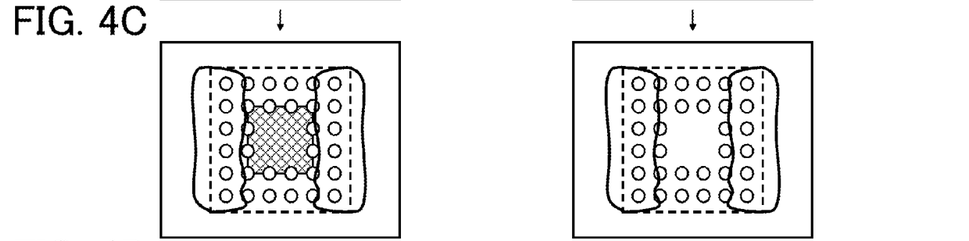
Figure 4D:
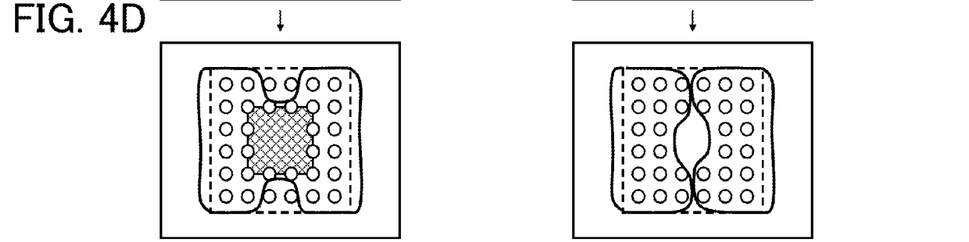
Figure 4E:
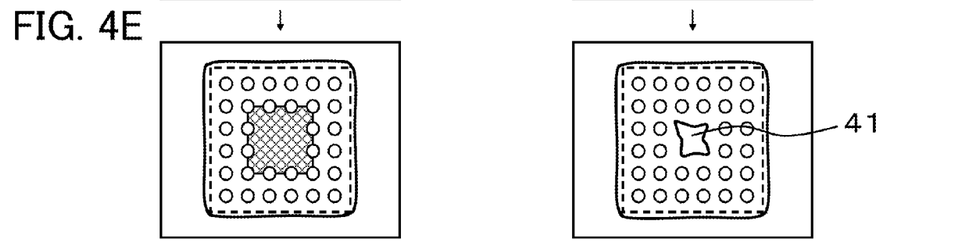

Example 1, including the lyophilic area, and a Comparative Example, not including the lyophilic area, are provided, as shown in FIG. 4A. The underfill resin 40 is applied from left and right sides of the semiconductor components 20 of the Example 1 and the Comparative Example, as shown in FIG. 4B. The state of the underfill resin permeation transitions as shown in FIGS. 4C, 4D and 4E in this order.

In the Comparative Example, not having the lyophilic area, the underfill resin from the left and right sides are not unified preferentially in the vicinity of the center area, but an air sink 41 is formed. Since the underfill resin 40 is not permeated into the air sink 41, resulting in a lowered reliability. Moreover, since the size or shape of the air sink 41 may not be controlled, there may occur accidental failure. Although the underfill resin may be applied only from one side for permeation, there is the possibility that the permeation is halted halfway in case the BGA component is larger in size.

Conversely, there is provided in Example 1 the lyophilic area 30 in a mid area of the substrate. Hence, the underfill resin 40 from both the left and right sides, arriving at the lyophilic area 30, is spread at a time because of a higher rate of permeation of the underfill resin into the inside of the lyophilic area 30. The underfill resin 40, proceeding towards the mid area, is unified preferentially in the mid area. It is then permeated evenly so that there is formed no air sink.

Figure 5:
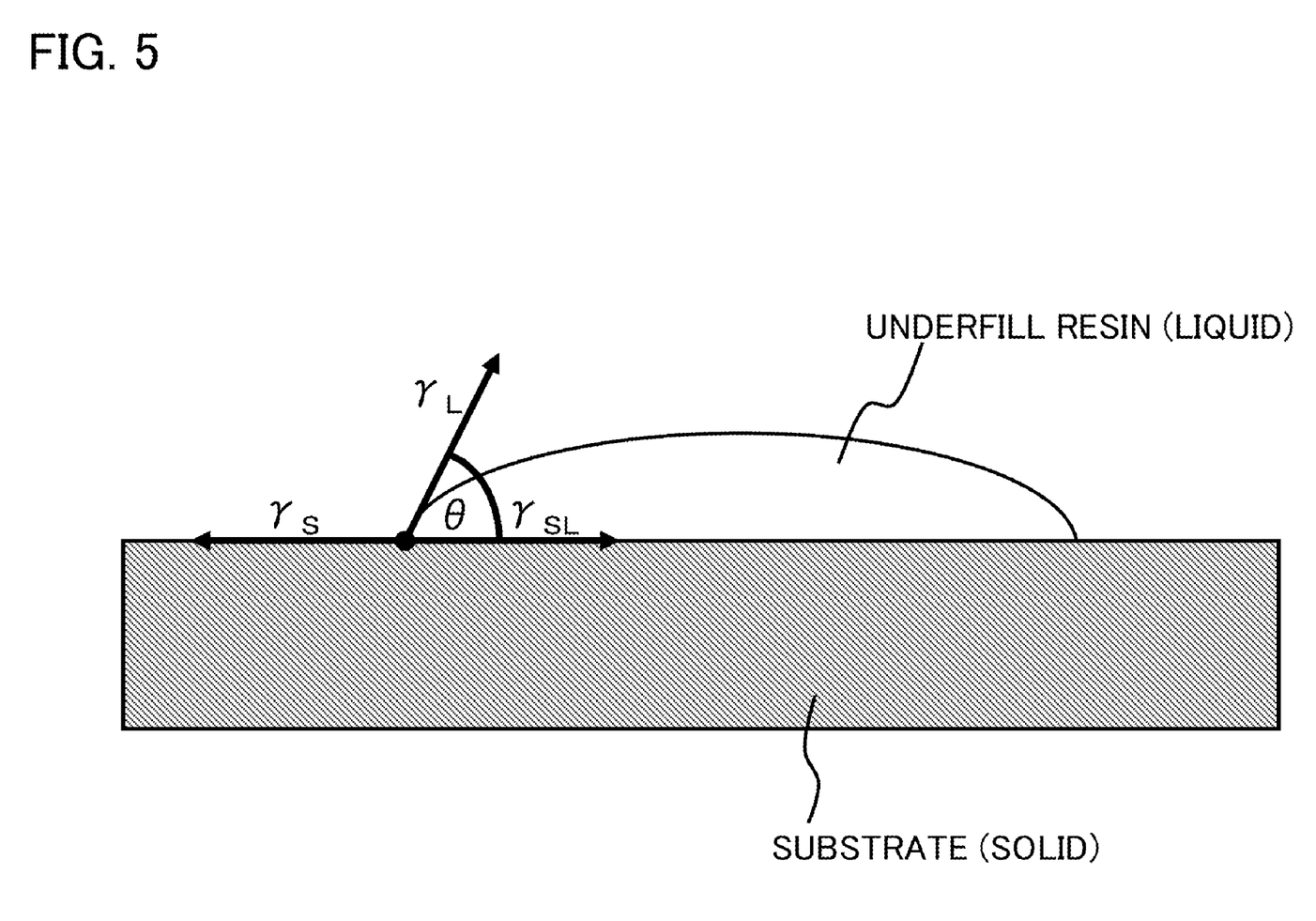
FIG. 5 is a schematic view for illustrating lyophilicity.

The lyophilicity of the semiconductor device according to Example 1 of the present invention will now be described with reference to the drawings. FIG. 5 illustrates how the lyophilicity is in play.

It is observed that lyophilicity and lyophobicity are prescribed by the contact angle of the liquid on a solid surface. In general, there is no definite reference that a substance is lyophilic for a contact angle not higher than a certain and certain value. Referring to FIG. 5, a contact angle $\theta$ may be expressed by the following Equation 1:

$$\cos\theta = (\gamma_S - \gamma_{SL})/\gamma_L \qquad \text{[Equation 1]}$$

where $\gamma_S$ is the energy on the solid surface, $\gamma_L$ is the energy on the liquid surface and $\gamma_{SL}$ is the energy on the interface between the liquid and the solid.

The smaller the contact angle, the higher becomes the permeability. It is thus seen that, with the constant energy on the liquid surface $\gamma_L$, lyophilicity is displayed in case the energy on the solid surface $\gamma_S$ is high and the energy on the interface $\gamma_{SL}$ is low. The effect of illumination of the ultraviolet rays on lyophilic-processing the film of titanium oxide is described in detail in Non-Patent Document 1. In short, the lyophilic-processing of the film of titanium oxide may be obtained because the energy on the solid surface is kept high as a result of illumination of ultraviolet rays. The film of titanium oxide usually has the contact angle with respect to water of ca. 30°. It is lowered on illumination for one hour to 5° and, after illumination for two hours, it is lowered to approximation equal to 0°. If the film is subsequently stored in a dark place, the contact angle is gradually increased. Specifically, the contact angle becomes 5° and 30° after 200 hours and 1500 hours, respectively.

In Example 1, even if the underfill resin 40 is coated from one or two sides, the speed of permeation to a mid area of the substrate where the semiconductor component 20 is provided becomes faster. In addition, since the permeability becomes higher, the underfill resin may reliably be permeated even through a narrow gap. Moreover, the route of permeation may be freely set by controlling the lyophilic area 30 or by controlling the degree of lyophilicity. It is thus possible to realize ideal permeation such that air sink in the mid area of the package is caused to disappear (i.e., expelled) and subsequently the underfill resin is allowed to be permeated to the peripheral region. It is also possible to deliver the underfill resin 40 in stability in a manner with only little variations. It is noted in general that, if the gap between the substrate 10 and the semiconductor component 20 is reduced, the device is lowered in reliability. According to the present invention, underfill permeation is possible even if the gap between the substrate 10 and the semiconductor component 20 is reduced, and hence the interval may be reduced. Since the air sink in the mid portion of the semiconductor component 20 may be removed, it is possible to relieve the stress of the substrate 10 otherwise caused due to heating/cooling. Since the air sink in the mid portion of the semiconductor component 20 may be removed, it is possible to reduce the adverse effect of the distortion of the substrate on the components mounted on the reverse side in case of packaging on both substrate sides. Since the lyophilic area may improve lyophilicity between the surface of the solder resist 15 and the underfill resin 40, the underfill resin may be improved in bonding performance.

Example 2

A semiconductor device according to Example 2 of the present invention will now be described. In forming the lyophilic area (30 of FIGS. 1 to 3) of Example 1, the titanium oxide film is formed on the solder resist. Then, only the portion of the titanium oxide film, exposed via the opening in the mask, is turned into the lyophilic area 30 by irradiation with ultraviolet rays. In forming the lyophilic area (30 of FIGS. 1 to 3) of Example 2, no titanium oxide film is to be formed at the outset in the portion of the substrate which desirably is not to be lyophilic. To this end, a mask is used. After removing the mask, the substrate is irradiated with ultraviolet rays to turn the titanium oxide film in its entirety into the lyophilic area (30 of FIGS. 1 to 3). This may yield a merit that a mask need not be used during the lyophilic-processing.

Example 3

The semiconductor device according to Example 3 of the present invention will now be described. In Example 3, the titanium oxide film as used in Examples 1 and 2 for forming the lyophilic area (30 of FIGS. 1 and 2) is not used. Instead, the surface of a solder resist (15 of FIG. 3) is modified. This method may also be effective. In this case, a mask opened only at a portion thereof in register with an area desired to be lyophilic-processed is formed after forming the solder resist. Then, only the portion of the solder resist exposed via the opening in the mask (15 of FIG. 3) is turned by ion irradiation into a lyophilic area (30 of FIGS. 1 to 3). This formulation gives rise to a merit that no titanium oxide film needs to be used during the lyophilizing processing.

Example 4

Figure 6:
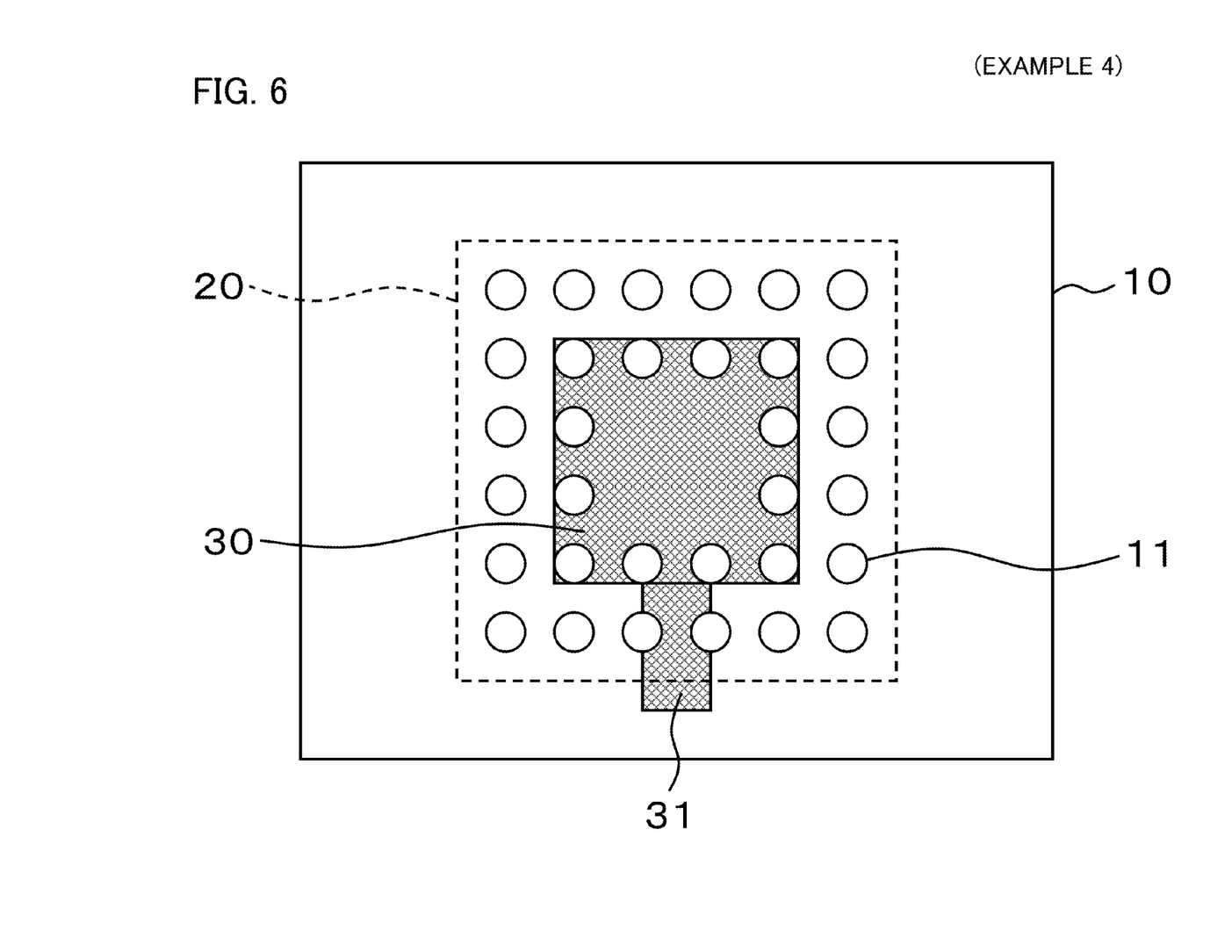
FIG. 6 is a schematic plan view showing a lyophilic area on a substrate of a semiconductor device according to Example 4 of the present invention.
Figure 7:
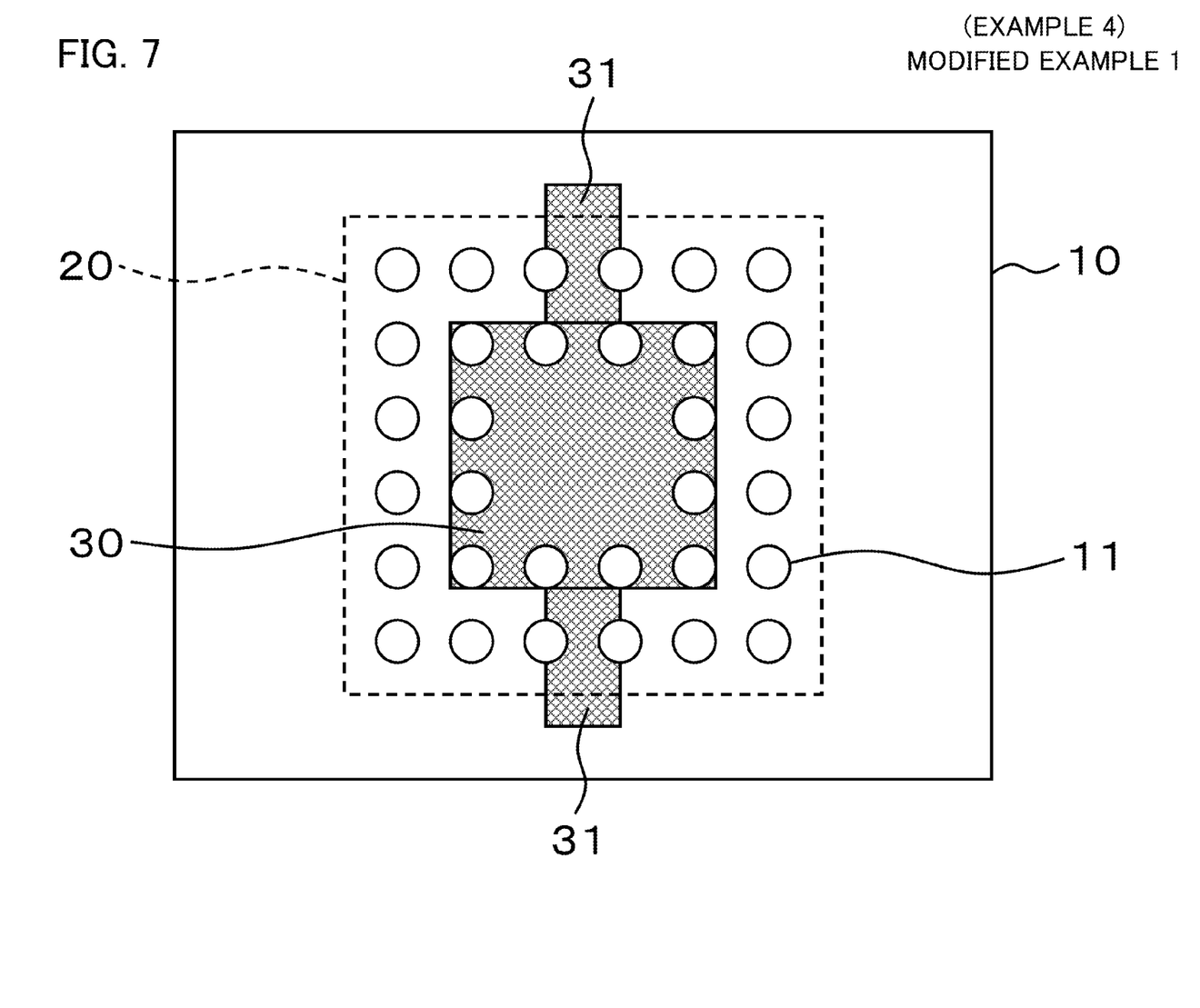
FIG. 7 is a schematic plan view showing a first modified lyophilic area of a substrate of a semiconductor device according to Example 4 of the present invention.
Figure 8:
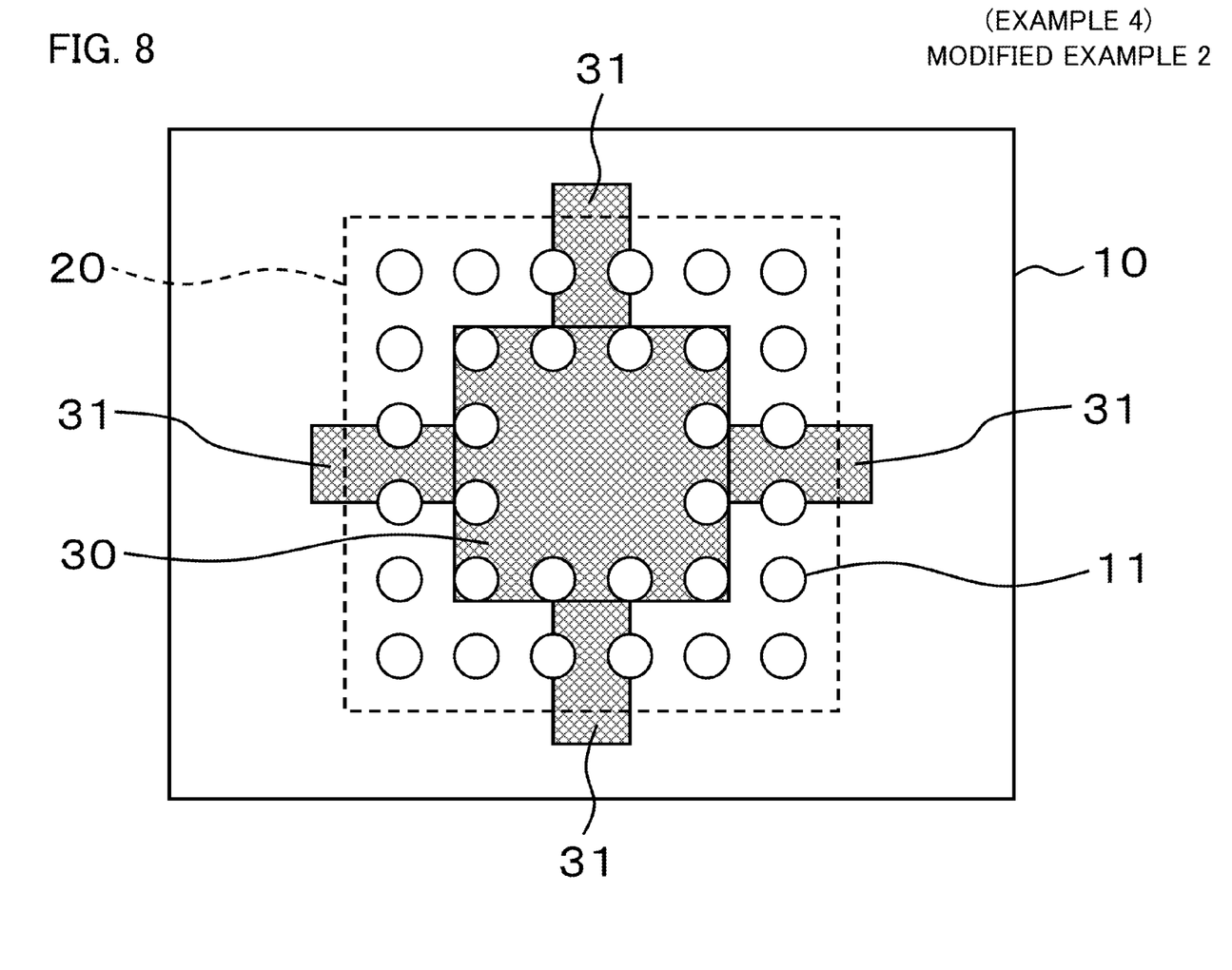
FIG. 8 is a schematic plan view showing a second modified lyophilic area of a substrate of a semiconductor device according to Example 4 of the present invention.
Figure 9:
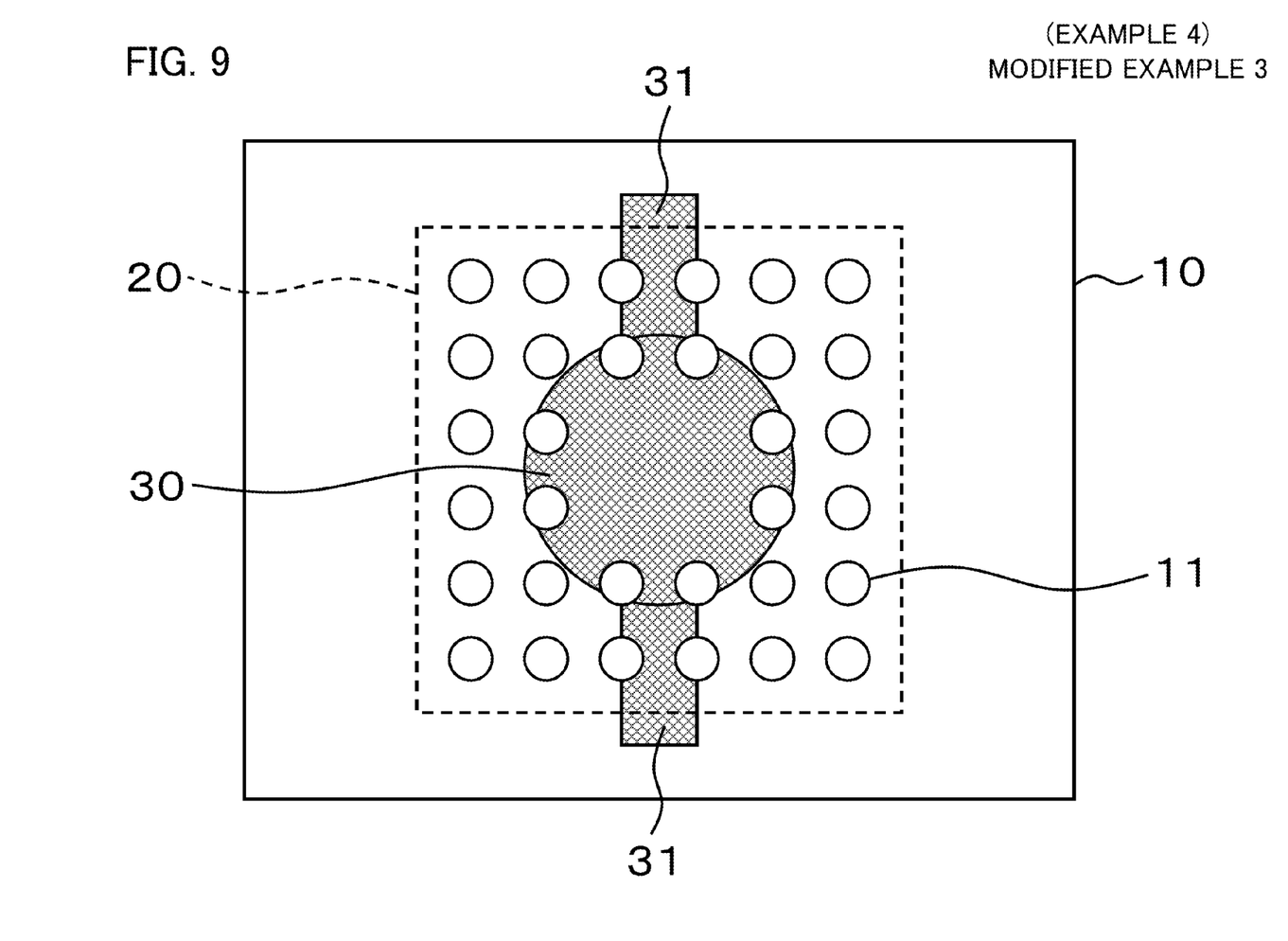
FIG. 9 is a schematic plan view showing a third modified lyophilic area of a substrate of a semiconductor device according to Example 4 of the present invention.

The semiconductor device according to Example 4 of the present invention will now be described. FIG. 6 is a schematic plan view showing a lyophilic area on a substrate of a semiconductor device according to Example 4 of the present invention. FIG. 7 depicts a schematic plan view showing a modification 1 of a lyophilic area on a substrate of a semiconductor device according to Example 4 of the present invention. FIG. 8 depicts a schematic plan view showing a modification 2 of a lyophilic area on a substrate of a semiconductor device according to Example 4 of the present invention. FIG. 9 is a schematic plan view showing a modification 3 of a lyophilic area on a substrate of a semiconductor device according to Example 4 of the present invention.

In Example 4, one or more guide paths 31 are outwardly extended from the lyophilic area 30 formed at the center of an area of a surface of the solder resist (15 of FIG. 3) carrying the semiconductor component 20, as shown in FIGS. 6 to 9. Similarly to the lyophilic area 30, the guide path(s) 31 is formed by selectively performing lyophilic-processing on the solder resist (15 of FIG. 3). The guide path(s) 31 is connected to the lyophilic area 30.

In the formulation of FIG. 6, the underfill resin (40 of FIG. 2) is applied from the side of the semiconductor component 20 from which the guide path is derived. The underfill resin (40 of FIG. 2) may thus be preferentially permeated via the guide path 31 to the lyophilic area 30 and thence permeated into remaining portions. The underfill resin (40 of FIG. 2) may thus be permeated into the area where the semiconductor component 20 is mounted. Here, the lyophilic area 30 is shown as a square in FIG. 1. If the guide path 31 to a center area is provided in the vicinity of an applying area, as shown in FIG. 6, the underfill resin may be applied only at one side for permeation subsequently.

A plurality of guide paths 31 may also be provided, as shown in FIGS. 7 and 8. The lyophilic area 30 may also be circular in shape and a plurality of guide paths 31 may be provided, as shown in FIG. 9.

In Example 4, meritorious effects similar to those of Example 1 may be obtained. By providing the guide paths 31 in consideration of, for example, permeability of the underfill resin (40 of FIG. 2) or pad positions, it is possible to expedite the permeation of the underfill resin to the center of the area where the semiconductor component 20 is mounted.

Figure 10:
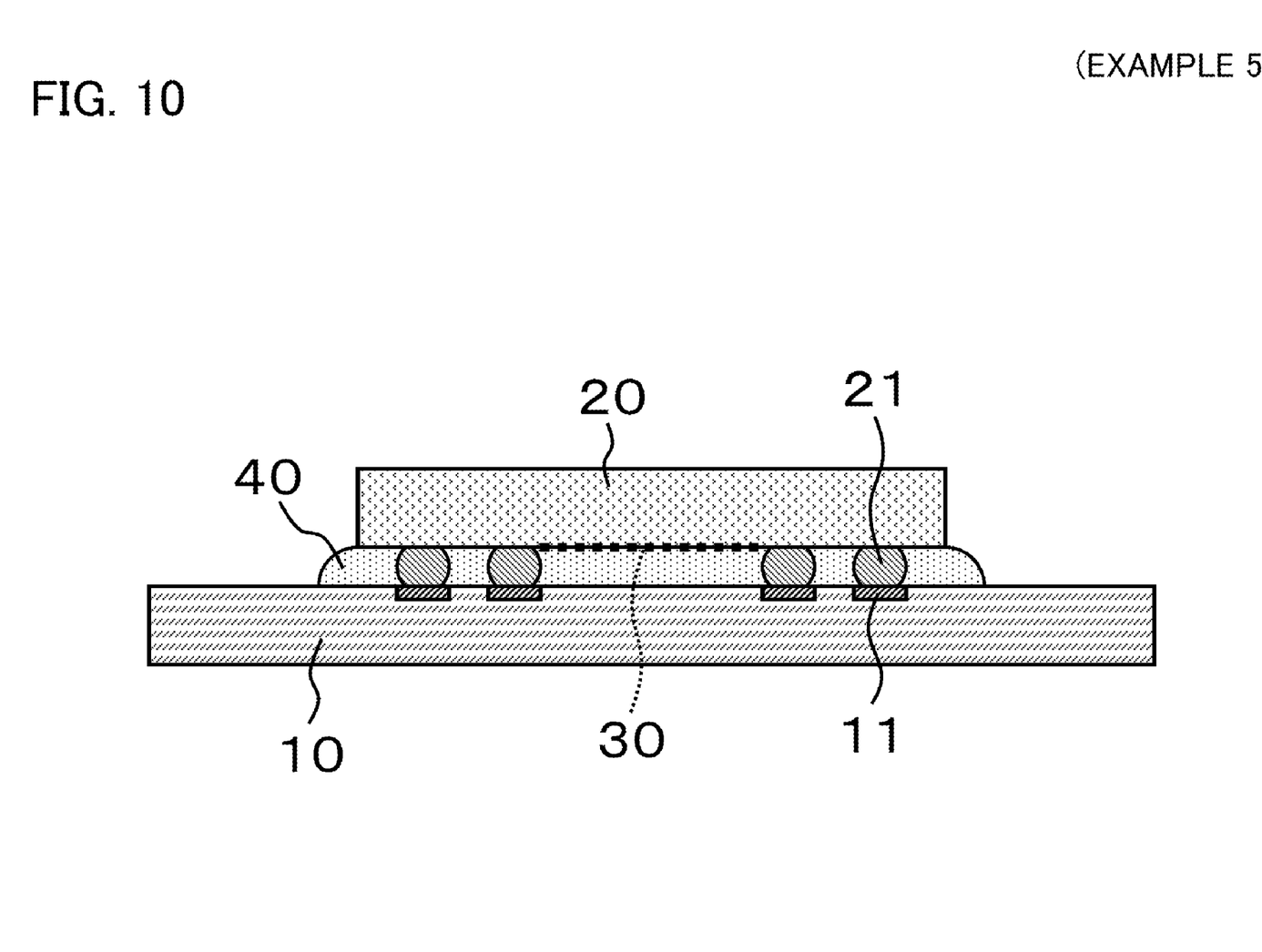
FIG. 10 is a schematic cross-sectional view showing a formulation of a semiconductor device according to Example 5 of the present invention.

A semiconductor device according to Example 5 of the present invention will now be described. FIG. 10 is a schematic cross-sectional view showing the formulation of the semiconductor device according to Example 5 of the present invention.

In Examples 1 to 4, the lyophilic area (30 of FIG. 2) is provided on the substrate 10. In Example 5, the lyophilic area 30 is formed only on the reverse surface (terminal side surface) of the semiconductor component 20, as shown in FIG. 10. The plane shape of the lyophilic area 30 of the semiconductor component 20 may be similar to that of the lyophilic area (30 of FIG. 2) or the guide path 31 of FIGS. 1 and 6 to 9. The surface of the semiconductor component 20, facing the substrate 10, with the exception of the pad surface, is coated with a solder resist, not shown, to prevent shorting with neighboring solder bumps 21. The lyophilic area 30 is formed at a preset portion of the surface of the solder resist, not shown, of the semiconductor component 20. The lyophilic-processing may be carried out in the same way as in Examples 1 to 3. Example 5 gives rise to meritorious effects similar to those of Example 1.

Example 6

Figure 11:
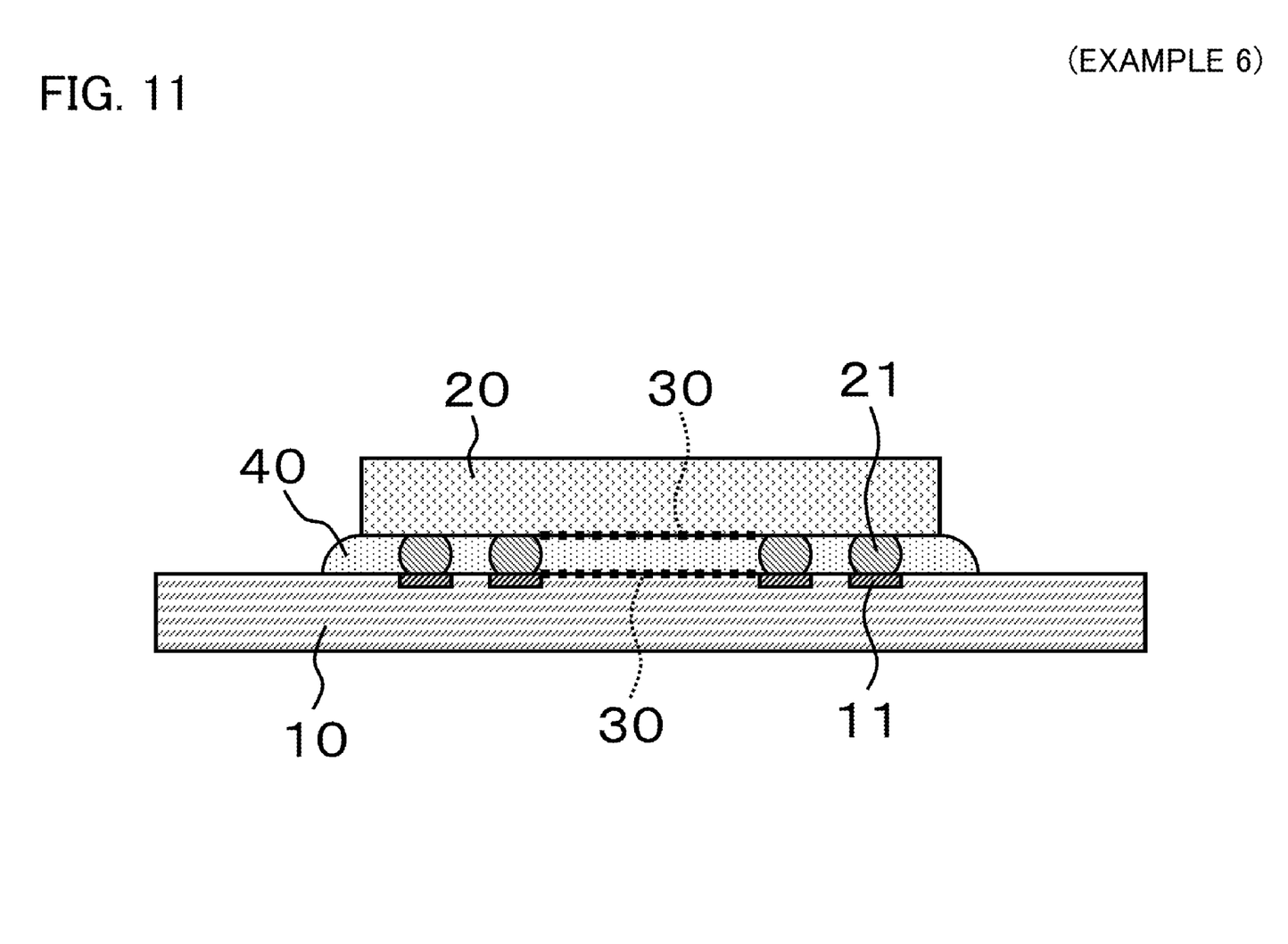
FIG. 11 is a schematic cross-sectional view showing a formulation of a semiconductor device according to Example 6 of the present invention.

A semiconductor device according to Example 6 of the present invention will now be described with reference to the drawings. FIG. 11 depicts a schematic cross-sectional view showing the formulation of the semiconductor device according to Example 6 of the present invention.

In Examples 1 to 4, the lyophilic area (30 of FIG. 2) is formed on the substrate 10. In Example 6, the lyophilic area 30 is formed on the semiconductor component 20 and on the substrate 10, as shown in FIG. 11. The lyophilic area 30 is formed in a preset region of the reverse surface of the semiconductor component 20 (terminal side surface) and in a preset region of the surface of the solder resist 15 of the substrate 10. A lyophilic area 30 on the semiconductor component 20 and a lyophilic area 30 on the substrate 10 face each other and are in register, that is, face symmetrical, relative to each other. The plane shape of the lyophilic area 30 may be similar to the lyophilic areas 30 of FIGS. 1 and 6 to 9 (guide paths 31). The lyophilic-processing may be carried out in the same way as in Examples 1 to 3. In Example 6, the meritorious effects similar to those of Example 1 may be obtained. In addition, the solder resist may be permeated at a higher rate towards the center of the area in which the semiconductor component 20 is mounted.

Various changes or adjustments of the exemplary embodiments or Examples may be made within the framework of the total disclosure of the present invention, inclusive of the claims, based on its basic technical concept. Various combinations of disclosed elements may also be selected within the framework of the claims of the present invention.

What is claimed is:

1. A semiconductor device, said semiconductor device carrying a semiconductor component on a substrate and having an underfill resin applied in a gap between said substrate and said semiconductor component;

said semiconductor device comprising:

a lyophilic area in a portion of a region of one or both of said substrate and said semiconductor component which is in contact with said underfill resin; said lyophilic area being processed to exhibit lyophilicity with respect at least to said liquid underfill resin in comparison with an ambient region of said lyophilic area.

2. The semiconductor device according to claim 1, wherein said lyophilic area is processed so as to have a contact angle smaller than that of said ambient region of said lyophilic area.

3. The semiconductor device according to claim 1, wherein said ambient region of said lyophilic area is more lyophobic at least to the liquid underfill resin than said lyophilic area.

4. The semiconductor device according to claim 1, wherein said ambient region of said lyophilic area is coated with a solder resist; and wherein a film of titanium oxide lyophilic-processed by exposure to ultraviolet light is formed on a solder resist in said lyophilic area.

5. The semiconductor device according to claim 1, wherein said ambient region of said lyophilic area is coated with a solder resist; and wherein in said lyophilic area, the surface of said solder resist is modified by ion irradiation.

6. The semiconductor device according to claim 1, wherein said lyophilic area is arranged at a center part of the area where at least said semiconductor component is mounted.

7. The semiconductor device according to claim 1, wherein said lyophilic area includes one or more guide paths extended from a mid part of an area where said semiconductor component is mounted.

* * * * *